(12) United States Patent
Barker et al.

(10) Patent No.: US 9,943,969 B2
(45) Date of Patent: Apr. 17, 2018

(54) CLEAN TRANSFER ROBOT

(71) Applicant: DYNAMIC MICRO SYSTEMS, Radolfzell (DE)

(72) Inventors: David Barker, Walnut Creek, CA (US); Robert T. Lobianco, Sunnyvale, CA (US); Bhavesh Amin, Livermore, CA (US)

(73) Assignee: Brooks Automation (Germany) GmbH (DE)

(*) Notice: Subject to any disclaimer, the term of this patent is extended or adjusted under 35 U.S.C. 154(b) by 265 days.

(21) Appl. No.: 14/311,340

(22) Filed: Jun. 22, 2014

(65) Prior Publication Data

US 2014/0298946 A1    Oct. 9, 2014

Related U.S. Application Data

(63) Continuation of application No. 12/103,505, filed on Apr. 15, 2008, now Pat. No. 8,757,026.

(51) Int. Cl.
*B25J 18/00* (2006.01)
*B25J 19/00* (2006.01)
*H01L 21/677* (2006.01)

(52) U.S. Cl.
CPC .... *B25J 19/0058* (2013.01); *H01L 21/67742* (2013.01); *H01L 21/67766* (2013.01); *Y10T 74/20305* (2015.01)

(58) Field of Classification Search
CPC ............ B25J 19/0058; H01L 21/67742; H01L 21/67766; Y10T 74/20305
See application file for complete search history.

(56) References Cited

U.S. PATENT DOCUMENTS

| | | |
|---|---|---|
| 4,972,731 A | 11/1990 | Akutagawa et al. |
| 5,746,566 A | 5/1998 | Pfarr et al. |
| 6,347,990 B1 | 2/2002 | Sung et al. |
| 7,648,327 B2 | 1/2010 | Bonora et al. |
| 8,070,408 B2 | 12/2011 | Behdjat et al. |
| 8,757,026 B2 | 6/2014 | Barker et al. |

(Continued)

FOREIGN PATENT DOCUMENTS

| | | |
|---|---|---|
| EP | 0786800 | 7/1997 |
| GB | 2217107 | 10/1989 |

(Continued)

OTHER PUBLICATIONS

International Search Report, International Application No. PCT/IB2009/051577, dated Oct. 21, 2009.

(Continued)

*Primary Examiner* — Michael S Lowe
(74) *Attorney, Agent, or Firm* — Perman & Green LLP; Colin C. Durham

(57) ABSTRACT

A robot with improved cleanliness for use in a clean environment is disclosed, having a uniform flow through the open interface between the clean environment and the interior of the robot housing, passing the particle generation area to an exhaust port, keeping the particles from the clean environment. The uniform flow reduces or eliminates the back flow, and further allows the scalability of the open interface to prevent particles generated from moving mechanisms within the robot housing to contaminate the clean environment. The uniform flow can be established by designing the flow dynamic, centering the exhaust port, or by restricting the flow along the elongated slot, for example, by uniformly restricting the flow along the elongated slot, or by implementing a restrictor along the elongated slot.

20 Claims, 9 Drawing Sheets

(56) References Cited

U.S. PATENT DOCUMENTS

| | | | |
|---|---|---|---|
| 2002/0159864 A1* | 10/2002 | Lowrance | H01L 21/67126 414/217 |
| 2003/0044261 A1 | 3/2003 | Bonora et al. | |
| 2003/0217610 A1 | 11/2003 | Nagai et al. | |
| 2004/0144316 A1 | 7/2004 | Lee et al. | |
| 2006/0018736 A1 | 1/2006 | Lee et al. | |
| 2008/0138177 A1 | 6/2008 | Klomp et al. | |
| 2009/0081005 A1 | 3/2009 | Miyasaka | |
| 2009/0082895 A1 | 3/2009 | Barker et al. | |

FOREIGN PATENT DOCUMENTS

| | | |
|---|---|---|
| JP | 02232194 | 9/1990 |
| JP | 05008194 | 1/1993 |
| JP | 05016092 | 1/1993 |
| JP | 09205047 | 8/1997 |
| JP | 11235690 | 8/1999 |
| JP | 2006019726 | 1/2006 |
| JP | 2006286682 | 10/2006 |
| JP | 2006310561 | 11/2006 |
| WO | 0124233 | 4/2001 |
| WO | 0179090 | 10/2001 |
| WO | 03021642 | 3/2003 |
| WO | 03021643 | 3/2003 |

OTHER PUBLICATIONS

International Preliminary Report on Patentability, International Application No. PCT/IB2009/051577, dated Oct. 19, 2010.

* cited by examiner

CLEAN TRANSFER ROBOT

This application is a continuation of and claims priority from U.S. patent application Ser. No. 12/103,505, which is now U.S. Pat. No. 8,757,026, filed on Apr. 15, 2008, entitled "Clean transfer robot; which is incorporated herein by reference.

FIELD OF THE INVENTION

The present invention relates to apparatuses and methods to transfer objects, and more particularly to clean transfer robot with reduced particulates in clean environment.

BACKGROUND OF THE INVENTION

Robot assemblies are an important component in automation, especially in manufacturing facilities and manufacturing equipments. For example, in the semiconductor industry, robot arms are used to handle semiconductor wafers, flat panel display, LCD, reticles, masks, or carrier boxes.

In the semiconductor fabrication facility, robot can be used to transport work pieces, typically stored in carrier boxes, from one location to another location, from one equipment type to another piece of equipment. In a process system, a robot is typically used to remove the work pieces from the carrier boxes, and then load them into a load lock. Another robot can be used to move the work piece from the load lock into a processing chamber and from one processing chamber to another processing chamber. Thus within a processing system, there might be a plurality of robots, each one is designed for a particular task. The processing system could be a deposition system, an etch system, a lithography system, a metrology system, an inspection system, an implantation system, a treatment system, or any work piece processing system.

Semiconductor fabrication processes require high level of cleanliness, and thus impurities such as contaminants or particles must be prevented as much as possible from entering the clean environment during the production of the semiconductor device. Conventionally, clean environments include a fan and filter unit (FFU) that circulates the air through the clean environment and filters the air entering the clean environment. Thus particles generated within the clean environment remain in the clean environment until being exhausted. To achieve the desired cleanliness, it is desirable to minimize the number of particles generated in the clean environment, especially for transfer robot with many moving parts.

SUMMARY

The present invention, in general, pertains to methods and apparatuses for a robot with improved cleanliness for use in a clean environment. The present clean robot comprises a moving mechanism covered by a robotic housing having an elongated slot providing fluid communication between the inside of the robotic housing and the clean environment. According to an embodiment, the present robot exhibits uniform flow throughout the elongated slot, flowed from the clean environment to the inside of the robotic housing, passing the particle generation area to an exhaust port. The flow exhausts the particles generated by the moving mechanism, keeping them from the clean environment. The uniform flow reduces or eliminates the back flow, thus further improves the cleanliness of the clean environment. The uniform flow can allow the scalability of the elongated slot, meaning the cleanliness of the system is not compromised regardless of the length of elongated slot. The uniform flow can be established by restricting the flow along the elongated slot, for example, by uniformly restricting the flow along the elongated slot, or by implementing a restrictor along the elongated slot. The restrictor can comprise a plurality of holes, short slits or a long slits along the direction of the elongated slot. According to another embodiment, a clean robot is disclosed for transferring workpiece in a clean environment with minimum particle entering the clean environment. According to still another embodiment, a method is disclosed for transferring workpiece with minimum particle generation in a clean environment.

Embodiments of the present invention disclose enclosing the movement mechanism within a robotic housing and exhausting the enclosed volume to outside the clean environment. The robotic housing further comprises an elongated slot interfacing the clean environment and the dirty environment inside the robotic housing. The moving mechanism within the robotic housing protrudes to the clean environment, preferably by a robot part connected to a robot arm, and moves along the elongated slot. The exhaust mechanism generates a flow, starting from the clean environment, passing through the elongated slot to the exhaust port, carrying the particles generated by the moving mechanism. The exhaust mechanism preferably comprises a blower with exhaust guides to guide the flow from the clean environment to the outside area.

Embodiments of the present invention further disclose generating substantially uniform flow along the elongated slot toward the exhaust port. The uniform flow can reduce or eliminate back flow from the dirty environment within the robotic housing back to the clean environment. The uniform flow can pass through the movement mechanism to attract the generated particles.

Embodiments of the present invention further disclose restricting the exhaust flow along the direction of the elongated slot to generate a substantial uniform flow along the elongated slot. The restrictor can be designed to generate a uniform flow along the elongated slot, and minimizing back flow. The restriction preferably comprises a plurality of holes, or a narrow split, and disposed in the vicinity of the elongated slot or the moving mechanism.

In an aspect, the moving mechanism comprises a linear moving mechanism having a linear guide moving a robot part. The linear guide is preferably disposed in the vicinity of the elongated slot, and the flow restrictor is preferably disposed in the vicinity of the linear guide. The linear guide is also preferably disposed in the exhaust flow path. The moving mechanism travels along the linear guide, generating particles. The generated particles can be swept away in the exhaust flow, traveling from the elongated slot to the restrictor to the exhaust port. In another aspect, the moving mechanism comprising a plurality of moving mechanisms, such as a second linear moving mechanism having a second linear guide moving a second robot part along a second elongated slot. The moving mechanism can comprise a rotational mechanism, rotating an axis along a circular slot.

In a preferred embodiment, the present invention discloses a clean transfer robot within a clean environment so that the movement mechanism of the transfer robot generates minimum particles to the clean environment. In one aspect, the clean transfer robot comprises an exhaust mechanism to exhaust the volume inside the clean robot to the outside of the clean environment. In another aspect, the clean transfer robot comprises a uniform flow along an elongated slot, which separates the clean environment and the inside volume of the transfer robot, and which allows the moving mechanism within the transfer robot to protrude to the clean environment for moving a workpiece in the clean environment. The uniform exhaust flow along the elongated slot can minimize the back flow of particles to the clean environment. In yet another aspect, the clean transfer robot comprises a restrictor between the elongated slot and the exhaust port to establish a uniform exhaust flow. The transfer robot can comprise various mechanism for moving a workpiece, such as one or more linear movements for transfer workpieces in or out of the clean environment or to move up or down, a rotational movement for rotating the workpiece itself or to rotating the whole transfer robot to face a process chamber.

In another preferred embodiment, the present invention discloses a clean chamber having a clean transfer robot so that the movement mechanism of the transfer robot generates minimum particles to the clean environment. The clean chamber can be an EFEM (equipment front end module), or a transfer module interfacing process chambers.

DETAILED DESCRIPTION OF THE PREFERRED EMBODIMENTS

Embodiments of the present invention disclose methods and apparatus for improving a clean environment having moving mechanisms for workpiece processing and transfer. Semiconductor processing equipment requires clean environment, since particles can generate defects on the fabrication of the device wafer. The clean environment can be established with a fan and filter unit, generating a clean and laminar flow in the cleaning enclosure. A perforated plate can be positioned at the opposite end of the fan/filter unit to ensure laminar flow, preventing stagnation and dead space. The walls have highly polished surfaces, thus there is no particle generation, and the clean environment can be kept clean. The clean environment can also comprise movement mechanism, for example, to transfer or rotate a workpiece. The movement mechanism can generate particles, which can be deposited on the workpiece to cause defects.

According to an embodiment, the present robot exhibits uniform flow throughout the open interface, flowed from the clean environment to the inside of the robotic housing, passing the particle generation area to an exhaust port. The uniform flow can be established by restricting the flow along the open interface, comprising a plurality of holes, short slits or a long slits along the direction of the elongated slot.

In an aspect, the restrictor comprises a plurality of holes (round or elongated holes) for moving the air from the clean environment, through the elongated slot to the inside of robot housing, passing through the moving mechanism (linear guide, rotation belt, joints, gears, etc.), before exhausting the generated particles to the exhaust part, preferably outside the clean environment. A filter can optionally included for trapping the particles, and thus the exhaust flow can be returned to the clean environment. With the flow uniformly distributed throughout the elongated slot, the generated particles from the moving mechanism can be effectively exhausted without scattering and back flow out to the clean environment.

The uniformity of the flow can be measured by the reduction in the back flow, thus a non-perfectly uniform flow is within the scope of the invention, as long as the flow can reduce the back flow. For example, a uniform flow can be established by implementing a restrictor, which provides less back flow or a better uniform flow.

In an embodiment, the present invention discloses apparatuses and methods for improving transport equipment of semiconductor fabrication objects, such as semiconductor wafers, reticles, flat panel displays. The improvements can comprise an integration of clean robot into a clean environment, such as a transfer module or an EFEM.

Figure 1:
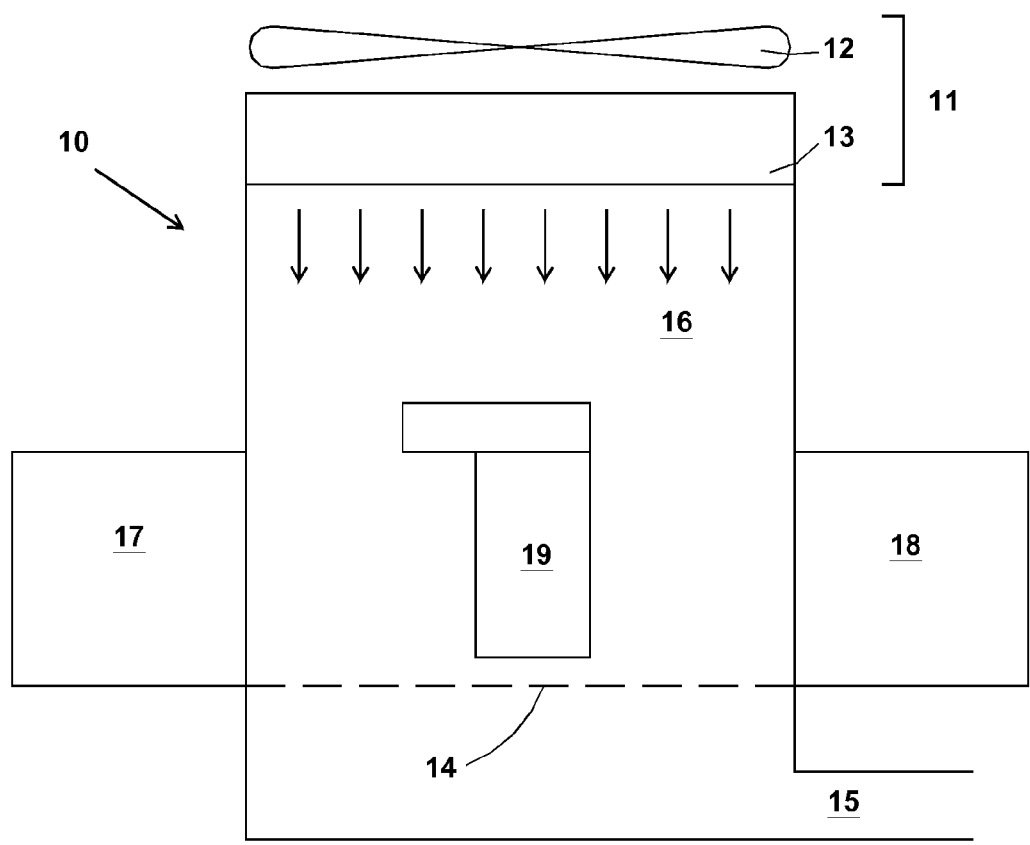
FIG. 1 illustrates an exemplary clean environment.

FIG. 1 illustrates an exemplary clean environment, for example, an EFEM 10. A fan/filter unit (FFU) 11 comprising a fan 12 and a filter 13 is mounted on top of the EFEM, together with a sheet metal panel, preferably a perforated plate 14 at the bottom. The FFU 11 generates clean flow through the clean environment 16, and exhausts through the perforated plate 14, which allows the exhaust flow from the FFU 11 to an exhaust port 15 to pass to the ambient environment. The perforated plate is designed for reducing dead space and stagnant flow, having the flow straight from the FFU 11 to the exhaust port 15.

The FFU 11 can be adjusted to control the rate and quality of the air through the EFEM 10. A number of FFU 11 may be required depending of the size and volume of the clean environment 16 to maintain the desired environmental conditions. Air may be drawn into the clean environment by the FFU 11 and vented out through the perforated holes in the perforated plate 14 at the bottom. Alternatively, the EFEM may be an inert enclosure, and a flow recirculation system (not shown) may be included so that the air flow created by the FFU 11 is completely contained and re-circulated.

The FFU 11 and the perforated plate 14 can form an efficient clean environment with the filter 13 requiring periodic replacement. Generally, the pressure within the clean environment 16 is preferably maintained higher than the surrounding atmosphere. This pressure differential can prevent unfiltered air, e.g. particles or contaminants, from entering the clean environment, and can be blown out of the clean environment accordingly. Alternatively, the clean environment may be sealed with a recirculation system to isolate the clean environment from the surrounding ambient.

The EFEM 10 can be connected to a loading/unloading system 17 for receiving a container such as a FOUP, and a chamber such as a process chamber 18. A robot mechanism 19 is disposed in the clean environment 16 for transferring workpiece (e.g., wafer) between the FOUP 17 and the process chamber 18. The air flow can be designed to accommodate the FOUP 17 door open/close, or the process chamber 18 door open/close.

The robot mechanism 19 has moving mechanisms which are moving parts and tend to create particles. To prevent the particles from entering the cleaning environment and contaminating the transferred workpiece, the moving mechanism can be sealed within the robotic housing. Such seal can be used for a rotating shaft, for example, with an o-ring seal or a Ferro fluid seal. However, sealing might be impractical for linear motion. Thus embodiments of the present invention disclose open interface with flow generation to create a flow from the clean environment. In an aspect, the flow is distributed uniformly along the open interface to reduce particle back flow. The flow can be exhausted to outside the clean environment, thus eliminating the need for filter unit. For example, a blower can be mounted on a side of the robot, continuously pulling air from the clean environment, through the open interface, and then exhausting the air out into the outside of the clean environment. Alternatively, a pump can be used to create a negative pressure in the robot housing for generating the flow.

The movement mechanism of transfer robot is purged continuously with uninterrupted air passage through the movement mechanism. The air flow along the exhaust guide within the interior of the robot housing carries any particles generated due to frictional wear between moving components of the movement mechanism such as rotating or sliding mechanism.

Figure 2:
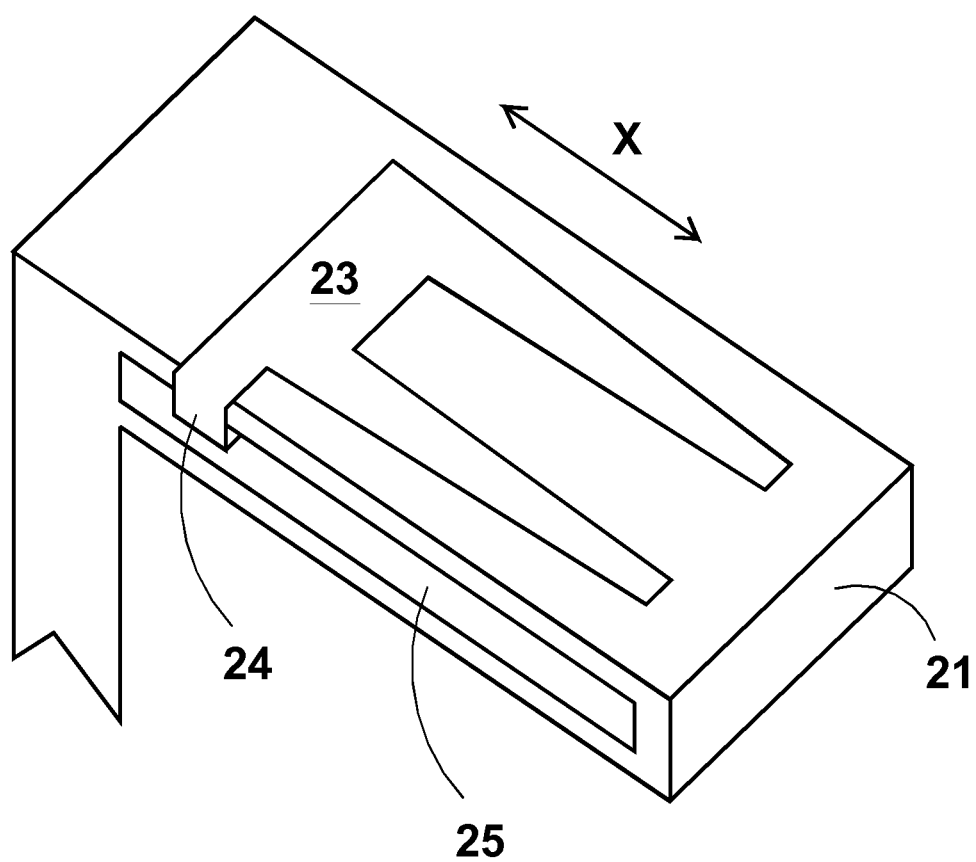
FIG. 2 shows an exemplary basic robot assembly in a clean environment.

FIG. 2 shows an exemplary basic robot assembly in a clean environment, comprising a robotic housing 21, and an end effector 23 to transfer an object in an x-direction. The robot assembly further comprises an x-movement mechanism (not shown), preferably disposed within the robotic housing 21, which moves a robot part 24 connected to the end effector 23 along the x direction. The robot part 24 moves along an elongated slot 25, which is an open interface between the clean environment and the inside of the robotic housing 21.

In a preferred embodiment, the present invention discloses a flow, preferably uniform flow along the length of the elongated slot 25, from the clean environment, passing through the elongated slot 25, and exhausting to an exhaust port, preferably outside of the clean environment. The flow passes through the movement mechanism and removes the particles generated by the movement mechanism to the exhaust port, preventing the generated particles from entering the clean environment.

Figure 3:
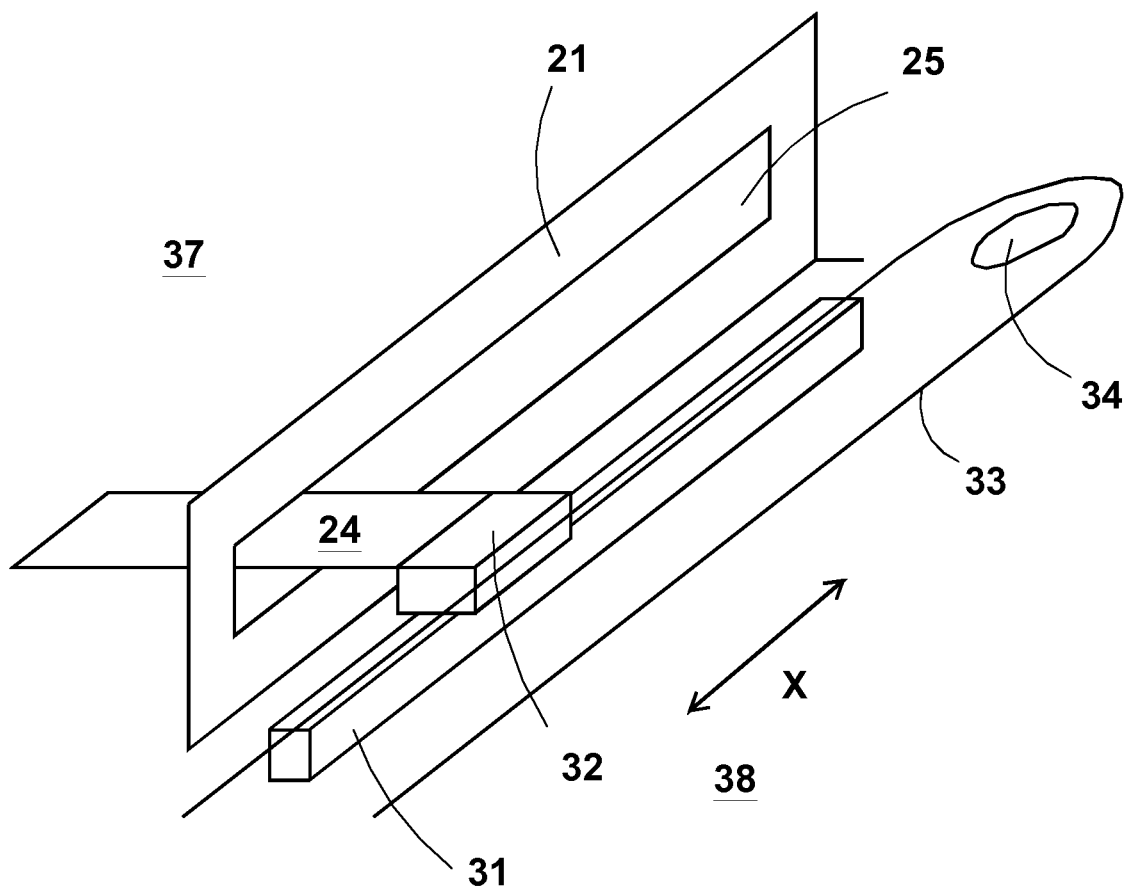
FIG. 3 illustrates an inside view of the robot assembly.

FIG. 3 illustrates an inside view of the robot assembly, focusing around the robot housing wall 21 separating the clean environment 37 and the inside of the robot housing 38. The elongated slot 25 is disposed in the housing wall 21, providing fluid communication between the clean environment 37 and the interior of the robot housing 38. In a preferred embodiment, the elongated slot 25 is an entrance, forming an open interface between the clean environment 37 and the somewhat dirtier environment 38 inside the robot housing. With the open interface of the elongated slot 25, air can be easily exchanged between these two environments. With the clean environment preferably under pressure, the flow tends to generate from the clean environment outward.

Further shown is the robot part 24, which is connected in one side to the end effector 23 (not shown), and is connected in the other end to a carriage 32 having linear bearing and riding on a linear guide 31 along the x direction. A motor system 34 drives a belt 33, which is attached to the carriage 32 for moving the carriage 32. The movement mechanism, which comprises the carriage 32 moving along the linear guide 31, and the motor 34 pulling the belt 33 and the carriage 32, is the source of some particle generation. The generated particles can be detrimental to the cleanliness of the clean environment 37 if allowed to escape to the clean environment.

Embodiments of the present invention disclose enclosing the movement mechanism within a robotic housing 21 and exhausting the enclosed volume to outside of the clean environment. A flow from the clean environment passes through the elongated slot 25 to the inside of the robot housing 38, carrying the particles generated by the moving mechanism to an exhaust port. The flow is preferably generated by a blower with an exhaust guide to carry the particles to the outside area.

Figure 4:
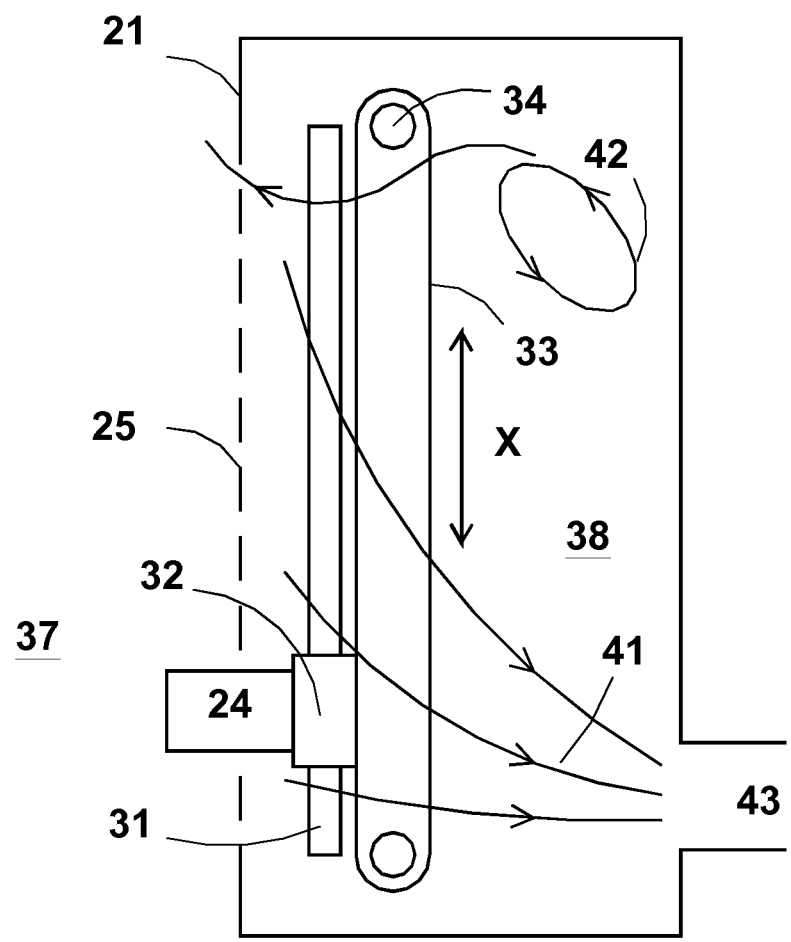
FIG. 4 illustrates a cross sectional view of the robot housing.

FIG. 4 illustrates a cross sectional view of the robot housing 21, separating the clean environment 37 and the dirty environment 38. An exhaust port 43 can generate a flow 41 from the clean environment 37, entering the elongated slot 25, passing through the particle generation area (the movement mechanism), and carrying the generated particles to the exhaust. The exhaust is preferably leading to the outside of the clean environment 37. Alternatively, the exhaust can recirculates back to the clean environment 37 with an additional filter to capture the particles (not shown).

The exhaust port 43 shown is positioned at one side of the robot housing, and thus offsetting the flow through the elongated slot 25. If the flow is not uniform, stagnant flow 42 or dead space can capture particles and back flows to the clean environment. Thus embodiments of the present invention further disclose generating substantially uniform flow along the elongated slot toward the exhaust port. The uniform flow can reduce or eliminate back flow from the dirty environment within the robot housing back to the clean environment. The uniform flow can pass through the movement mechanism to attract the generated particles. In a preferred embodiment, the robot housing configuration is designed to generate a uniform flow, for example, the exhaust port 43 is positioned in a center area to generate a uniform flow along the elongated slot 25. However, design restrictions and scalability of the elongated slot might make it difficult to generate a uniform flow along the elongated slot by the positioning of the exhaust port.

A preferred embodiment of the present invention restricts the exhaust flow along the direction of the elongated slot to generate a substantial uniform flow along the elongated slot. The exhaust port can be positioned anywhere downstream of the restrictor and would not interfere with the uniformity of the flow through the elongated slot. Further, the restrictor can accommodate the scalability of the elongated slot, since the restrictor can essentially establish a uniform flow regardless of the length of the elongated slot. The restriction preferably comprises a plurality of holes, or narrow slits, and disposed in the vicinity of the elongated slot or the moving mechanism.

Figure 5:
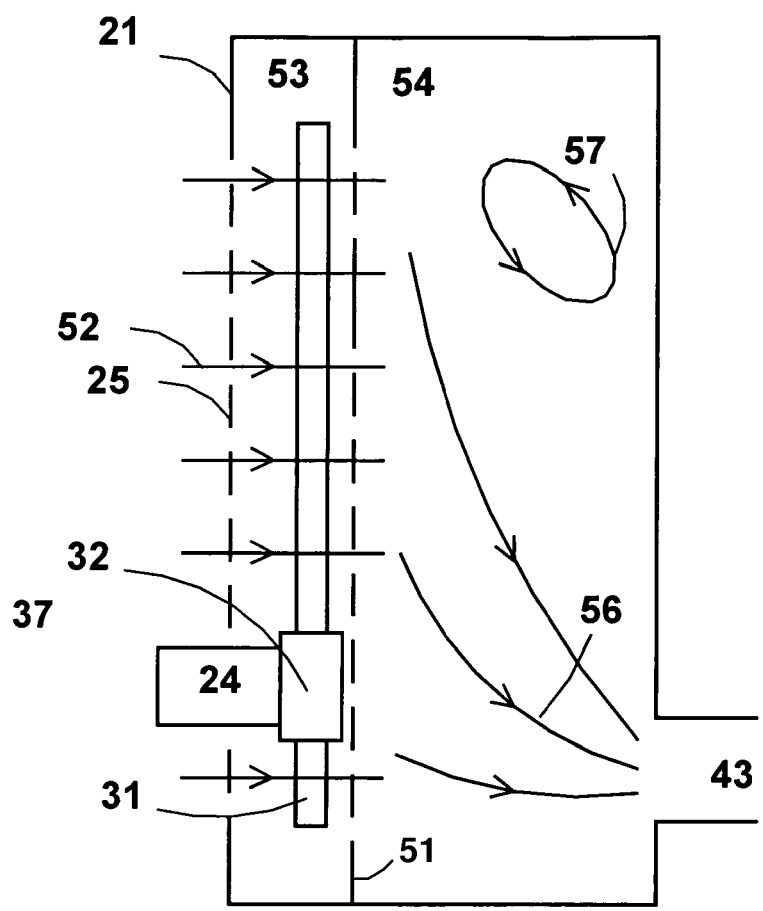
FIG. 5 illustrates an exemplary restrictor disposed in a robot housing.

FIG. 5 illustrates an exemplary restrictor 51 disposed in a robot housing 21, partitioning the volume inside the robot housing into two areas 53 and 54. The restrictor 51 is designed to generate a uniform flow 52 along the elongated slot 25, from the clean environment 37, passing through the movement mechanism (a linear guide is shown), and flowing 56 to the exhaust 43. The area 53 comprises essentially a uniform flow 52, carrying the generated particles to the area 54. The uniform flow 52 reduces back flow, preventing particles from escaping back to the clean environment. There might be stagnant flow 56 or dead space in the area 54, but with the restrictor blocking the way, particles in this area 54 are unlikely to enter the clean environment 37.

The moving mechanism shown comprises a linear moving mechanism having a linear guide 31 moving a robot part 24 through a carriage 32. In an aspect, the linear guide 31 is preferably disposed in the vicinity of the elongated slot 25, and the flow restrictor 51 is preferably disposed in the vicinity of the linear guide 31. The uniform flow is designed to flow from the elongated slot, passing the particle generation areas and exhausting to the exhaust port. The particle generation area can include the moving mechanism travels along the linear guide. In another aspect, the moving mechanism comprising a plurality of moving mechanisms, such as a motor and belt mechanism for moving the carriage 32, a second linear moving mechanism having a second linear guide moving a second robot part along a second elongated slot. The moving mechanism can comprise a rotational mechanism, rotating an axis along a circular slot.

Figure 6:
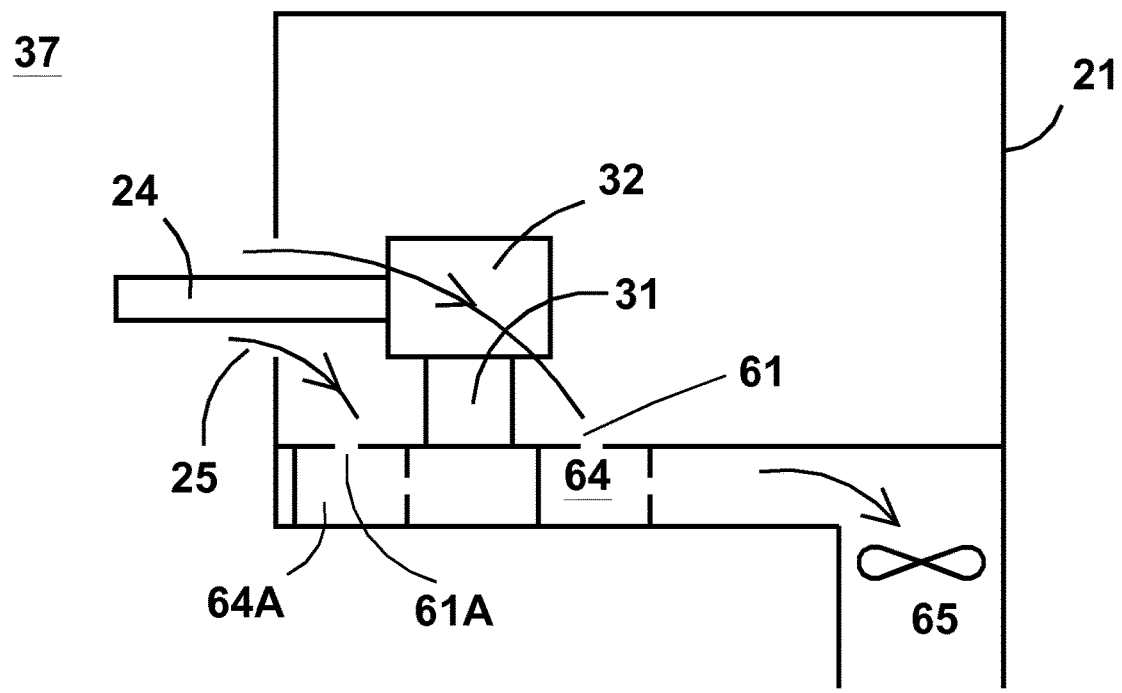
FIG. 6 illustrates an exemplary robot housing.

In a preferred embodiment, the restrictor is disposed in a bottom plane of the robot housing, with a channel for leading to flow to a blower. FIG. 6 illustrates a robot housing 21 housing the moving mechanism (robot part 24, linear guide 31 and carriage 32 are shown), separating the clean environment 37 by the elongated slot 25. The restrictor comprises a plurality of holes 61 and 61A, leading the flow to exhaust guides 64 and 64A, powered by a blower 65. The exhaust guides 64/64A can comprise an evacuation slot on each side of each linear guide rail 31, machined into the robot plate with a cover attached with holes 61/61A in it. The holes 61 and 61A can be disposed at both sides (or alternatively, at one side, either side, for example, only holes 61, or only holes 61A) of the linear guide 31 to put the particle generation area directly on the exhaust flow path. Holes 61A can be drilled at an angle from the opposite side of the rail guide 31 (opposite the holes 61) and communicate with the exhaust. As the air flows through the slot 25, it flows over the rail system 31 and into the exhaust guide 64 to the blower 65, through the holes 61. This flow might leave a dead zone beneath slot 25 and the rail guide system 31. Holes 61A can eliminate this eddy formation, reducing the dead zone by cross drilling into this dead zone and leading to the exhaust guide 64A to the exhaust. Particle scavenging can be improved with this cross holes 61A. Alternatively, exhaust guide 64 and 64A can be one connected exhaust guide, leading to the blower 65.

The robot assembly can comprise other movements, such as robot theta rotation, robot y- and z-movements. The exemplary robot assembly can also comprise other peripherals such as an alignment or OCR subsystem for object aligning or ID reading, and a rotation movement of a rotating chuck to align the object. The rotating chuck can also include an up/down movement, for example, to lift the object away from the end effector. The robot assembly is disposed in a clean environment, such as a transfer chamber, a front end module, or a front interface mechanism.

The robot body movement mechanism provides the movements needed for stationing the end effector in the right position for receiving or for placing an object. The robot body can comprise a z-direction motion to address all objects or chambers in a stacked configuration, and a y-direction motion to address object stations disposed linearly in a y direction. For object stations disposed in a circular or a surrounding configuration, the robot body mechanism can comprise a theta motion. For object stations disposed in a linear configuration, the robot body can comprise a linear motion such as a traverse track or a linear guide.

In an aspect, the robotic system comprises a robot body to support an end effector for moving an object in and out from the clean environment, and from/to a plurality of process or storage chambers coupled to the transfer environment, such as a process chamber, a load lock chamber, a FOUP (front end unified pod), or a FOSB (front opening shipping box). In a load lock, pod or box, the objects are typically stacked with a small pitch, order of a few millimeters. In a process chamber, the object is typically separate from a support, also a small distance order of a few millimeters. Thus the end effector is preferably a thin blade, as thin as practical. The end effector can comprises support pads for supporting the object and for preventing slippage. The end effector can comprise vacuum ports for holding the object. The end effector can comprise edge grips for edge contact handling. Further, the end effector can comprise a plurality of gas ports to provide an air cushion, thus the object can float on an air gap without touching any part of the end effector. The end effector can comprise edge pins for prevent slippage of the object. The end effector extending and retracting motions preferably comprise articulate joint arms or linear motions through linear guides, but can be any mechanical motions. The end effector can also provide lifting motion (e.g. z-direction) for lifting objects. The end effector can comprise edge gripping, air cushion, or vacuum suction for holding the object.

The robot assembly further can comprise a plurality of sensors, such as work piece positioning sensors, image sensing of position errors, RF electric field sensing, magnetic resonance sensing, laser scanning, sensing with photo detector arrays, motor operation sensing, arm position sensing, or any sensors related to the operation and service. Furthermore, the sensors provides the status and locations of the robot assembly, thus allowing the optimum utilization of the remaining operative part of the assembly, plus the alerting the operator for servicing the inoperative parts of the assembly.

The movement mechanism can comprise a plurality of articulate joint arms, linear movement, or rotational theta movement. The movement mechanisms can include linear track, linear guide, lead screw, multi-segmented articulated arms, frog arms, swivel arms, scissors and telescopic mechanism, four-bar linkage mechanism. The robot assembly can be constructed with motors such as servo motors with a synchronous device.

The transfer mechanism can also comprise at least two robot assemblies linked together as a unit. The transfer system thus can comprise a support body having at least two robot assemblies, an additional movement to move the support body, together with a controller for coordinating the robot assemblies. The two robot assemblies each can comprise an x-movement mechanism coupled to the support body for moving an end effector to handle an object in a station. The end effector typically rests within the support body, and extends outward to reach the station. A rotating mechanism corresponding to each end effector is further disposed on the support body for rotating an object when the end effector is at rest position. The additional movement mechanism, such as y-, z, or theta movement mechanism is designed for moving the support body or the two robot assemblies. Thus the two robot assemblies can move together as a unit with the additional movement mechanism, controlled by the controller for coordinating and synchronizing the movements for best efficiency.

Figure 7:
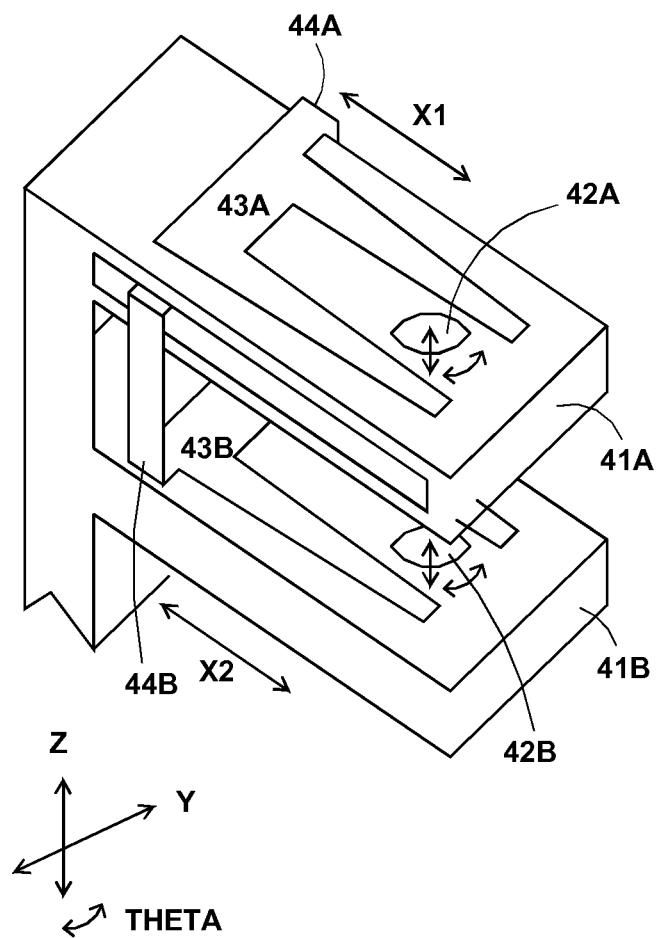
FIG. 7 shows an exemplary configuration of two robot assemblies.

FIG. 7 shows an exemplary configuration of two robot assemblies linked together as a unit at the end of the base sections 41A and 41B. Each robot assembly comprises a lift and rotating vacuum chuck, 42A and 42B respectively, together with an end effector, 43A and 43B respectively, traveling in the x direction. Optional OCR camera (not shown) can be disposed on the robot assembly for reading wafer ID. Each vacuum chuck can lift up and rotate to spin the wafer. Each end effector is connected to an x-movement mechanism, 44A and 44B respectively, allowing the end effector to extend and retract to handle a wafer in a storage station. The two x-movement mechanisms are shown to be disposed on opposite sides, with each mechanism attached to the corresponding base section. However, other configurations are possible, for example, both x-movement mechanisms 44a and 44B are disposed on the same side of the base sections 41A and 41B; both x-movement mechanisms 44a and 44B are disposed on a same base section e.g., 41A, on opposite sides or on the same side. If both x-movement mechanisms are disposed on a same base section 41A, the base section 41B can be merged to the robot body for supporting the rotating chuck 42B.

In a preferred embodiment, the present invention discloses a clean transfer robot within a clean environment so that the movement mechanism of the transfer robot generates minimum particles to the clean environment. In another preferred embodiment, the present invention discloses a clean chamber having a clean transfer robot so that the movement mechanism of the transfer robot generates minimum particles to the clean environment. The clean chamber can be a FIM (front interface mechanism), a FEM/EFEM (front end module or equipment front end module), or a transfer module interfacing process chambers, such as wafer sorter or stocker. The chambers can be arranged in a circular ring around the integrated transfer mechanism, arranged linearly at one side of the integrated transfer mechanism, or arranged linearly at both side of the integrated transfer mechanism. The present invention integrated transfer mechanism can also be used in a stocker or in the front end assembly to transfer work pieces between cassettes in a pod assembly. The front end assembly generally contains a horizontal motion robot assembly to move a work piece to the front end module or to the central module.

Figure 8:
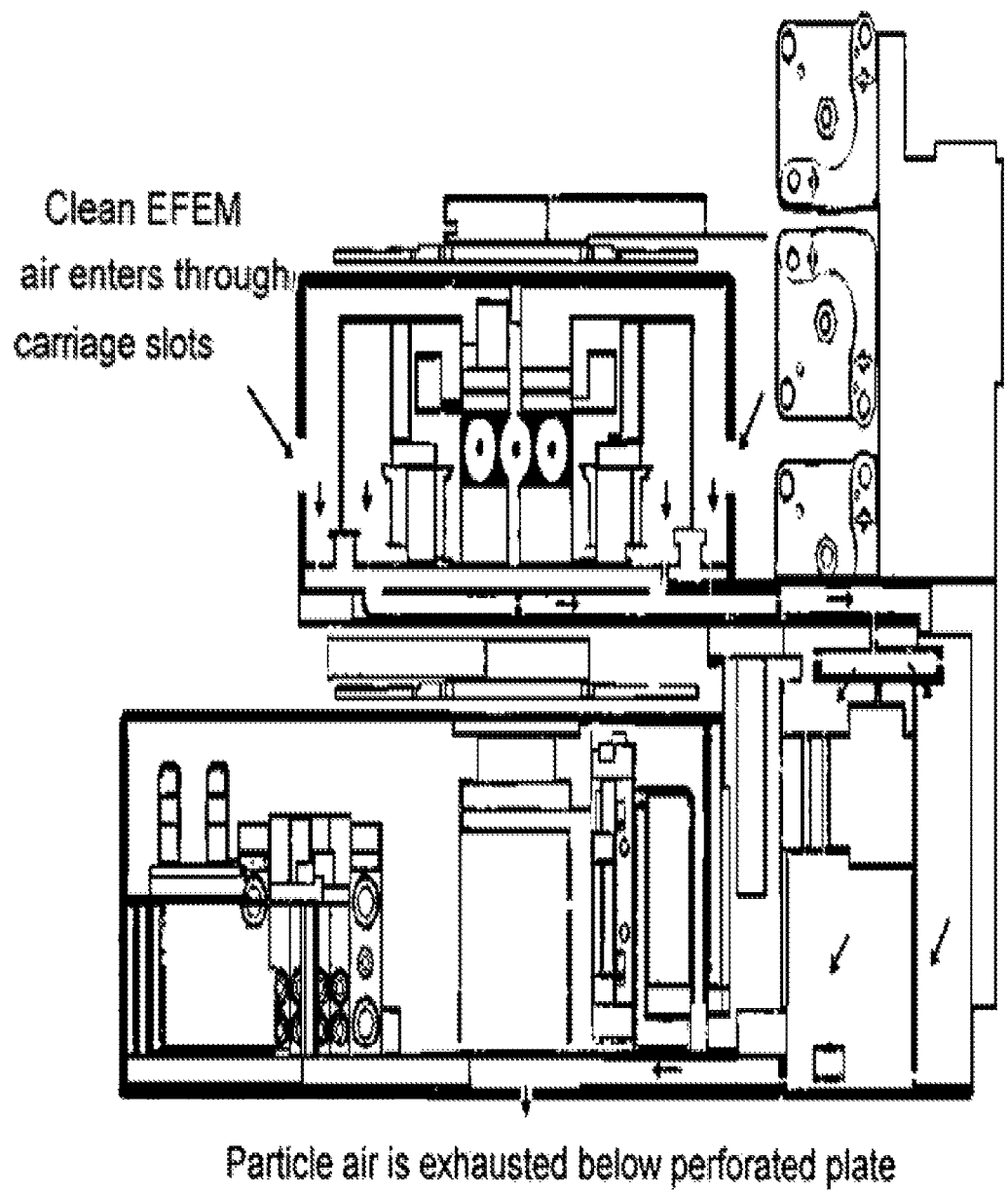
FIG. 8 illustrates a robot assembly according to exemplary embodiment of the present invention.

FIG. 8 illustrates a robot assembly according to exemplary embodiment of the present invention. The restrictor comprises a plurality of holes on the floor of the robot housing to exhaust the generated particles. To contain these particles, channels are machined running parallel to the linear rails. Covers are placed over these channels with holes (ports) located periodically over their entire length. The holes can be drilled diagonally and under the rails, communicating with the channels. Through the use of a motorized impeller, negative pressure is produced in the channels, generating an airstream along the entire run of the linear bearing, and on both sides of the linear carriage. This airstream constrains the particles being produced and prevents their escape into the clean space outside the robot. The particle air is ducted through a channeling system machined in the upper robot components and eventually dumped below the perforated plate that separates wafer clean space from mechanical space in the clean environment. Once exhausted, circulation of this particle air is prevented through the flow stream generated by the clean environment's fan filter unit. The present configuration can deliver a uniform flow stream in close vicinity to the linear rail system, which could potentially be used over long distances with better effectiveness.

Figure 9:
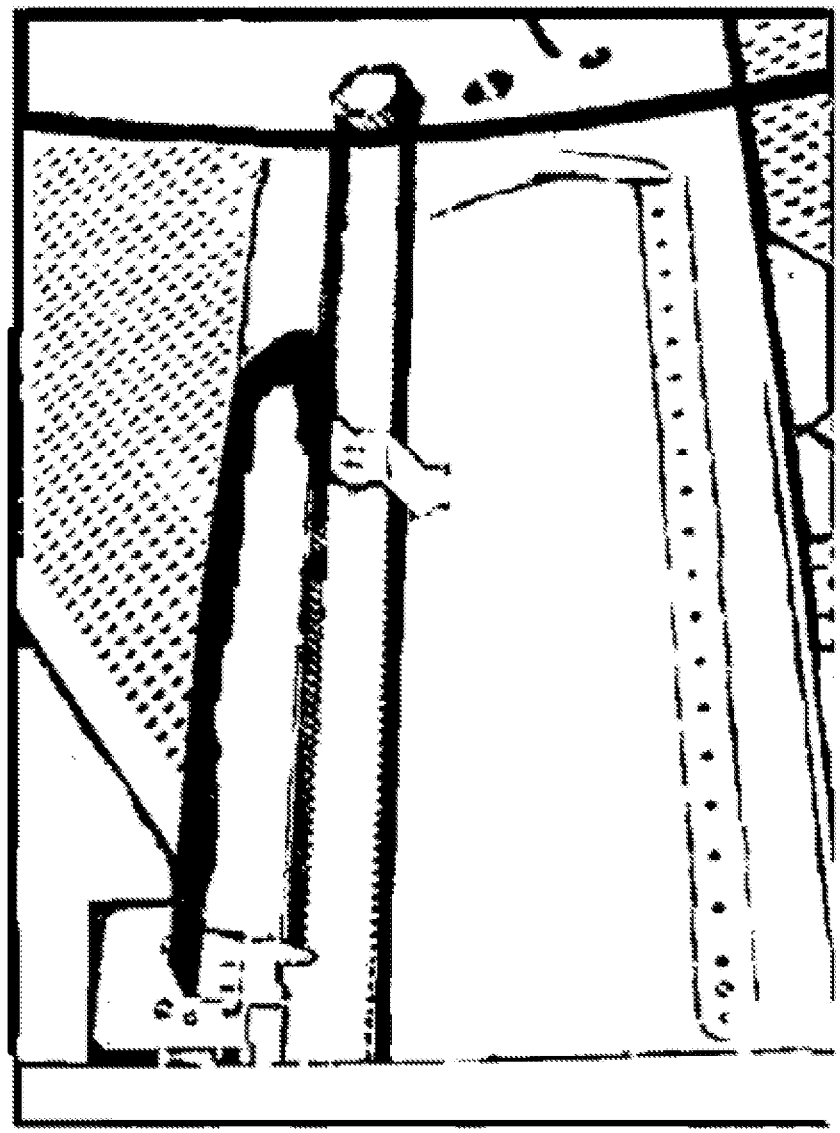
FIG. 9 illustrates a cross section of an exemplary robot assembly.

FIG. 9 illustrates a cross section of an exemplary robot assembly, with air flow pulling from the clean environment, through the hole restrictor and the channel to a motorized impeller assembly (e.g., a fan or a blower), and exhaust through a support column to the outside environment.

The many features and advantages of the invention are apparent from the detailed specification, and thus, it is intended by the appended claims to cover all such features and advantages of the invention, which fall within the true spirit, and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A robot for moving a workpiece in a clean housing that forms an enclosure having a clean environment therein forming an interior of the enclosure of the clean housing, the robot comprising:
   a robotic housing comprising an elongated slot connecting the clean environment of the enclosure of the clean housing and an environment within the robotic housing;
   a moving mechanism within the robotic housing and coupled to a robot part so as to move the robot part along the elongated slot, the robot part protruded to the clean environment of the enclosure of the clean housing;
   an exhausting mechanism coupled to the robotic housing for removing particles generated by the moving mechanism in the robotic housing and having a configuration effecting a clean environment isolation barrier isolating the particles from the clean environment of the enclosure of the clean housing, preventing exhaust from the robotic housing of particles into the enclosure of the clean housing and the clean environment thereof; and
   a flow restrictor extending along the elongated slot, disposed within the robotic housing and between the robotic housing and the exhaust mechanism, the flow restrictor being configured so as to be scaled such that flow within the robot housing, passing through the flow restrictor, is restricted depending on a whole length of the elongated slot to establish a substantial uniform flow evenly along the whole elongated slot regardless of the whole length of the elongated slot.

2. The robot as in claim 1 wherein the restrictor is disposed in a vicinity of the elongated slot.

3. The robot as in claim 1 wherein the restrictor comprises a plurality of holes along an elongated slot direction for distributing the substantial uniform flow along the elongated slot.

4. The robot as in claim 1 wherein the restrictor comprises a slit along an elongated slot direction for distributing the substantial uniform flow along the elongated slot.

5. The robot as in claim 1 wherein the moving mechanism comprises a linear guide along the elongated slot and wherein the restrictor is disposed in a vicinity of the linear guide.

6. The robot as in claim 1 wherein the exhaust mechanism removes particles in the robotic housing to an outside of the clean environment.

7. The robot as in claim 1 further comprising a filter for filtering the particles.

8. The robot as in claim 1 further comprising at least a robot moving mechanism attached to the robotic housing for moving the robotic housing.

9. An apparatus for moving a workpiece, comprising:
   a clean housing that forms an enclosure providing a clean environment therein forming an interior of the enclosure of the clean housing;
   a robotic housing disposed within the clean housing, the robotic housing comprising an elongated slot connecting the clean environment and an environment within the robotic housing;
   a linear moving mechanism comprising a linear guide within the robotic housing and coupled to a robot part so as to move the robot part along the elongated slot, the robot part protruded to the clean environment;

an exhausting mechanism coupled to the robotic housing for removing particles generated by the linear moving mechanism in the robotic housing to an outside of the clean housing, the exhausting mechanism having a configuration effecting a clean environment isolation barrier isolating the particles from the interior of the enclosure of the clean housing, preventing exhaust from the robotic housing of particles into the enclosure of the clean housing and the clean environment thereof;

a flow restrictor extending along the elongated slot, disposed within the robotic housing and between the clean housing and the exhaust mechanism, the flow restrictor being configured so as to be scaled such that flow within the robot housing, passing through the flow restrictor, is restricted depending on a whole length of the elongated slot to establish a substantial uniform flow evenly along the whole elongated slot regardless of the whole length of the elongated slot.

10. The apparatus as in claim 9 further comprising a fan filter unit and a perforated plate to provide the clean environment.

11. The apparatus as in claim 9 wherein the restrictor is disposed in a vicinity of the linear guide.

12. The apparatus as in claim 9 wherein the restrictor comprises a plurality of holes along an elongated slot direction for distributing the substantial uniform flow along the elongated slot.

13. The apparatus as in claim 9 further comprising at least a robot moving mechanism attached to the robotic housing for moving the robotic housing.

14. A method for improving a clean environment forming an interior of an enclosure of a clean housing and containing a moving mechanism, wherein the moving mechanism is disposed in a robotic housing and coupled to a robot part so as to move the robot part through an elongated slot connecting the clean environment and an inside of the robotic housing, the method comprising:

positioning the moving mechanism in a vicinity of the elongated slot;

exhausting, with an exhausting mechanism, the inside of the robotic housing to an outside of the enclosure of the clean housing, the exhausting mechanism having a configuration effecting a clean environment isolation barrier isolating the particles from the enclosure of the clean housing and the clean environment thereof, for preventing exhaust from the robotic housing of particles into the clean environment; and scalably restricting a flow from the elongated slot to the exhaust with a flow restrictor extending along the elongated slot, wherein the flow restrictor is configured to be scaled such that the flow from the elongated slot to the exhaust, passing through the flow restrictor is restricted as to provide a substantial uniform flow evenly along the whole elongated slot regardless of a whole length of the elongated slot.

15. The method as in claim 14 wherein restricting the flow comprises disposing a restrictor in a vicinity of the elongated slot direction.

16. The method as in claim 14 wherein restricting the flow comprises a plurality of holes along an elongated slot direction for distributing the flow along the elongated slot.

17. The method as in claim 14 wherein restricting the flow comprises a slit along an elongated slot direction for distributing the flow along the elongated slot.

18. The method as in claim 14 further comprising positioning the flow to pass through a particle generation area due to the moving mechanism.

19. The method as in claim 14 further comprising filtering the flow.

20. The method as in claim 14 further comprising moving the robotic housing through a second moving mechanism.

* * * * *